United States Patent [19]

Nishida et al.

[11] 4,000,507
[45] Dec. 28, 1976

[54] SEMICONDUCTOR DEVICE HAVING TWO ANNULAR ELECTRODES

[75] Inventors: Sumio Nishida; Katsuro Sugawara; Eiichi Yamada, all of Kodaira; Satoru Ito, Shinza; Kohei Yamada, Koganei, all of Japan

[73] Assignee: Hitachi, Ltd., Japan

[22] Filed: Jan. 20, 1975

[21] Appl. No.: 542,301

Related U.S. Application Data

[63] Continuation of Ser. No. 403,557, Oct. 4, 1973, abandoned.

[30] Foreign Application Priority Data

Oct. 4, 1972 Japan ..........................47-99060

[52] U.S. Cl. ................................ 357/52; 357/53; 357/55; 357/56; 357/68
[51] Int. Cl.² .................. H01L 29/34; H01L 29/40; H01L 29/06; H01L 23/48
[58] Field of Search ................ 357/52, 53, 55, 56, 357/68

[56] References Cited

UNITED STATES PATENTS

| 3,405,329 | 10/1968 | Loro et al. | 357/52 |
| 3,713,908 | 1/1973 | Agusta et al. | 357/35 |

FOREIGN PATENTS OR APPLICATIONS

| 2,031,082 | 4/1971 | Germany | 357/53 |

*Primary Examiner*—Edward J. Wojciechowicz
*Attorney, Agent, or Firm*—Craig & Antonelli

[57] ABSTRACT

In a semiconductor device wherein an insulating film is provided on that surface of a semiconductor substrate to which a base-collector junction extends, two annular electrodes are formed with the junction formed therebetween. One of the electrodes is maintained at base potential, while the other electrode is maintained at collector potential. Thus, moisture or like contaminants adhering to the insulating film are prevented from leading to the generation of excessive channel current.

13 Claims, 2 Drawing Figures

SEMICONDUCTOR DEVICE HAVING TWO ANNULAR ELECTRODES

This is a continuation of application Ser. No. 403,557, filed Oct. 4, 1973, now abandoned.

BACKGROUND OF THE INVENTION

1. Field of the Invention

The present invention relates to semiconductor devices and, more particularly, to a mesa type semiconductor device.

2. Description of the Prior Art

In a semiconductor device such as a transistor, water or moisture or any other contaminant may adhere directly to the semiconductor surface and give rise to a degradation in the characteristics of the device. It has been well known that, in order to prevent such a degradation, a protective film may be provided on the semiconductor surface. Even in a semiconductor device thus provided with a protective film, however, there have still arisen degradations in the characteristics such as an increase in leakage current and a decrease in the breakdown voltage of a P-N junction. As the result of various studies on the cause of the degradations, the following has been discovered. When any contaminant adheres to the protective film, it becomes ionized under the influence of a fringe electric field during the operation of the semiconductor device. The ions promote the formation of a depletion layer or a layer of an inverted conductivity type at that surface of a semiconductor region to which the end of a P-N junction extends. The depletion layer or the inversion layer extends to that part of the semiconductor surface which is not covered with the protective film and at a portion which contacts the base electrode, so that a large leakage current is generated.

The generation of the large leakage current leads to the occurrence of devices having nonconforming electrical characteristics. For example, it brings about an increase in $I_{CBO}$ (the collector-base reverse current of the transistor for an open emitter) during a high-voltage reverse bias test and a performance test of the semiconductor device.

SUMMARY OF THE INVENTION

It is, accordingly, an object of the present invention to provide a semiconductor device which prevents channel current from being generated due to an excessive spread of an inversion layer and a depletion layer at the surfaces of the base and the collector.

Another object of the present invention is to provide a semiconductor device which has stable electrical characteristics.

In order to accomplish such objects, the present invention is constructed such that annular protective electrodes are connected to the base surface and the collector surface on an oxide film at a semiconductor surface and with P-N junction formed therebetween. The protective electrodes are respectively maintained at the same potentials as the base potential and the collector potential.

PREFERRED EMBODIMENT OF THE INVENTION

Figure 1:
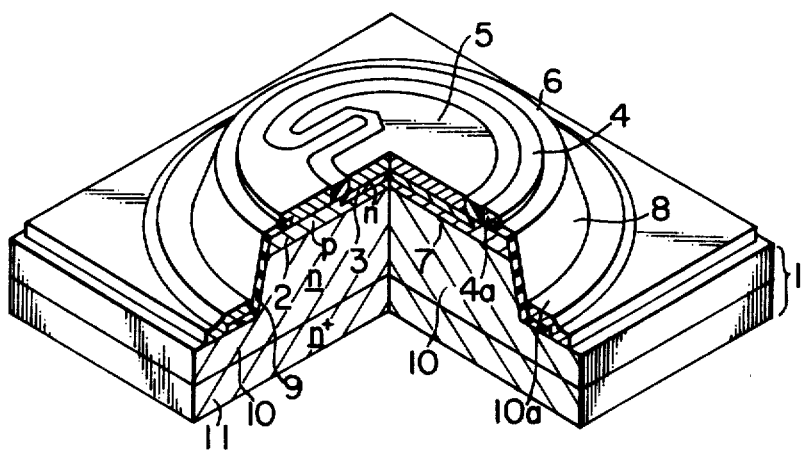
FIG. 1 is a perspective view, partially in cut-away section, showing a semiconductor device according to the present invention.
Figure 2:
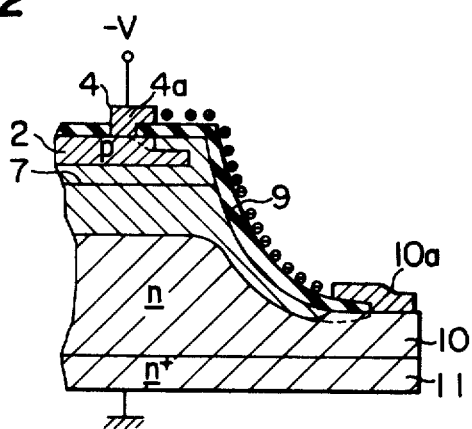
FIG. 2 is a vertical sectional view of a part of the semiconductor device in FIG. 1.

FIG. 1 shows an embodiment of the semiconductor device according to the present invention, and specifically illustrates an N-P-N mesa transistor formed of silicon. Referring to the figure, the mesa transistor is constructed of three regions made up of an N-type collector region 1, a P-type base region 2 and an N-type emitter region 3. Further, a mesa portion 6 is formed. The N-type collector region 1 is made of a silicon substrate which consists of a low resistivity N-type collector region 11 and an N-type high resistivity collector region 10. The P-type base region 2 is formed on the high resistivity collector region 10, and has a base electrode 4 held in nonrectifying contact thereon at the plateau surface portion of the transistor. A collector-base junction 7 is formed between the high resistivity N-type collector region 10 and the P-type base region 2 and extends to the sloping side surface portion of the transistor. On the N-type emitter region 3, an emitter electrode 5 formed within the P-type region 2 is held in nonrectifying contact. The mesa portion 6 is constructed of a mesa side face portion 8 and the N-type emitter region 3, the portion 8 being formed by etching a part of the P-type base region 2 and the N-type high-resistivity collector region 10. On those surface parts of the mesa portion 6 which are other than the contact portions of the base electrode 4 and the emitter electrode 5, a silicon oxide film 9 is formed. On an exposed part of the high resistivity collector region 10, there is formed a protective electrode 10a which is made of aluminum. The protective electrode 10a is extended onto the oxide film 9, and annularly surrounds the mesa portion 6. The base electrode 4 above the mesa portion 6 extends onto the film 9. The extended part forms a protective electrode of aluminum 4a, and annularly surrounds the mesa portion 6. With such construction, when the collector-base junction 7 is reverse-biased, as illustrated in FIG. 2, water, moisture or any other contaminant adhering to the oxide film 9 is ionized by a fringe electric field due to the reverse bias. As a result, positive charges are generated on the base side, and negative charges on the collector side. The charges are also created by deterioration of the oxide film. The positive and negative charges on the oxide film 9 cause the spread of an inversion layer or a depletion layer to the parts of the substrate surface under the oxide film of the P-type base region 2 and the N-type high-resistivity collector region 10. When the inversion layer and the depletion layer (parts of oblique lines in FIG. 2) arrive at the ends of the oxide film 9, as illustrated in the chain lines in FIG. 2, an excessive channel current is generated. By providing the foregoing protective electrodes 4a and 10a in a manner to extend on the oxide film 9, the inversion layer and the depletion layer do not reach the base and collector surface portions under the oxide film 9 covered with the protective electrodes 4a and 10a, and can be confined on these sides of the surface portions. It is thus possible to eliminate the influence of the ions generated by the fringe electric field, and to prevent the channel current from occurring.

Although the N-P-N mesa transistor has been cited as an example in the embodiment, it is needless to say that the present invention is also applicable by substituting the P- and N-types for each other. Similar effects are attained when the present invention is applied to a mesa diode, a planar diode or transistor and any other semiconductor device, and in addition to single elements, it is applicable to ICs and LSIs.

As described above, with the semiconductor device according to the present invention, it is possible to restrain the influence of the electric charges on the surface of the oxide film and to prevent channel current. In addition, a great effect is produced for stabilizing electrical characteristics of the semiconductor device.

While We have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim is:

1. A semiconductor device comprising:
   a semiconductor body having therein
   a first semiconductor region of a first conductivity type extending to a first surface portion of said body, and
   a second semiconductor region of a second conductivity type, opposite said first conductivity type, extending to a second surface portion of said body and forming with said first semiconductor region a P-N junction which extends to a surface portion of said body between said first and second surface portions of said body, said P-N junction being adapted to be reverse-biased;
   a protective film of insulating material disposed on said semiconductor body so as to cover that surface portion of said body to which said P-N junction extends;
   a first conductor layer being annularly located on a first portion of said protective film so as to cover part of said first semiconductor region but not to cross the termination of said P-N junction;
   a second conductor layer being annularly located on a second portion of said protective film so as to cover part of said second semiconductor region but not to cross the termination of said P-N junction;
   means for maintaining said first semiconductor region and said first conductor layer at a first prescribed potential, and
   means for maintaining said second semiconductor region and said second conductor layer at a second prescribed potential.

2. A semiconductor device according to claim 1, wherein each of said first and second conductor layers respectively extends to and contacts each of said first and second semiconductor regions.

3. A semiconductor device according to claim 1, wherein said protective film extends from said first surface portion of said body past said P-N junction and over said second surface portion of said body, and said first and second conductor layers are formed at opposite ends of said protective film on said first and second surface portions of said body respectively, to partially overlap said film and extend onto and contact said first and second semiconductor regions, respectively.

4. A semiconductor device according to claim 3, wherein said first and second prescribed potentials are such that said P-N junction is reverse-biased.

5. A semiconductor device according to claim 1, wherein said semiconductor body is a mesa-shaped body of semiconductor material having a plateau surface portion and a sloping side surface portion contiguous thereto, and wherein said first surface portion comprises said plateau surface portion and part of said sloping side surface portion contiguous to said plateau surface portion, while said second surface portion comprises the remaining part of said sloping side surface portion.

6. A semiconductor device according to claim 5, wherein said P-N junction extends to said sloping side surface portion of said semiconductor body.

7. A semiconductor device according to claim 6, wherein said semiconductor body further includes a third semiconductor region of said second conductivity type disposed in said first semiconductor region and extending to said plateau surface portion of said body and forming a further P-N junction with said first semiconductor region to thereby form a mesa transistor structure, said first region being the base region, said second region being the collector region, and said third region being the emitter region, and wherein said first and second prescribed potentials are such that the P-N junction between said first and second semiconductor regions, corresponding to the base-collector junction, is reverse-biased.

8. A semiconductor device according to claim 6, wherein said protective film extends from said plateau surface portion of said body down the sloping side surface portion of said body, and said first and second conductor layers are formed at opposite ends of said protective film on said plateau and sloping side surface portions of said body, respectively, to partially overlap said film and extend onto and contact said first and second semiconductor regions, respectively.

9. A semiconductor device comprising
   a semiconductor body having therein
   a first semiconductor region of a first conductivity type extending to a first surface portion of said body, and
   a second semiconductor region of a second conductivity type, opposite said first conductivity type, extending to a second surface portion of said body and defining with said first semiconductor region a P-N junction which extends to the surface of said body between said first and second surface portions;
   a protective film of insulating material disposed on said semiconductor body so as to cover that surface portion of said body to which said P-N junction extends, whereby said P-N junction terminates at said protective film;
   a first conductor layer annularly disposed on a first portion of said protective film so as to cover a portion of said first semiconductor region, but being spaced apart from the portion of said protective film at which said P-N junction terminates, so that said first conductor layer does not extend over the termination of said P-N junction; and
   a second conductor layer annularly disposed on a second portion of said protective film so as to cover a portion of said second semiconductor region, but being spaced apart from the portion of said protective film at which said PN junction terminates, so that said second conductor layer does not extend over the termination of said PN junction; and
   conductive means for respectively connecting each of said first and second conductor layers to each of said first and second semiconductor regions so that said first and second conductor layers, respectively, are held at first and second respective potentials such that said P-N junction is reverse-biased.

10. A semiconductor device comprising:
a semiconductor body having therein
 a first semiconductor region of a first conductivity type extending to a first surface portion of said body, and
 a second semiconductor region of a second conductivity type, opposite said first conductivity type, extending to a second surface portion of said body and forming with said first semiconductor region, a P-N junction which extends to one of said first and second surface portions of said body;
a protective film of insulating material disposed on said semiconductor body so as to cover that surface portion of said body to which said P-N junction extends;
first means for supplying first and second different potentials to said first and second semiconductor regions, respectively; to reverse bias said PN junction formed therebetween, with an inversion or depletion layer spreading along the surface of said body beneath said protective film, said first means comprising:
 a first conductor layer disposed in contact with said first semiconductor region at a location thereon spaced apart from said PN junction, to which said first potential is applied, and
 a second conductor layer disposed in contact with said second semiconductor region at a location thereon spaced apart from said PN junction, to which said second potential is applied; and
second means for preventing said spreading inversion or depletion layer from spreading to said first and second conductor layers comprising
 a third conductor layer contiguous with said first conductor layer extending onto and overlying said protective film toward said PN junction but terminating at a location overlying said first semiconductor region which is spaced apart from said PN junction, and
 a fourth conductor layer contiguous with said second conductor layer extending onto and overlying said protective film toward said PN junction but terminating at a location overlying said second semiconductor region which is spaced apart from said PN junction,
said first and third contiguous conductor layers being electrically isolated from said second and fourth contiguous conductor layers.

11. A semiconductor device according to claim 10, wherein said semiconductor body is a mesa-shaped body of semiconductor material having a plateau surface portion and a sloping side surface portion contiguous thereto, and wherein said first surface portion comprises said plateau surface portion and part of said sloping side surface portion contiguous to said plateau surface portion, while said second surface portion comprises the remaining part of said sloping side surface portion.

12. A semiconductor device according to claim 11, wherein said P-N junction extends to said sloping side surface portion of said semiconductor body.

13. A semiconductor device according to claim 12, wherein said semiconductor body further includes a third semiconductor region of said second conductivity type disposed in said first semiconductor region and extending to said plateau surface portion of said body and forming a further P-N junction with said first semiconductor region to thereby form a mesa transistor structure, said first region being the base region, said second region being the collector region, and said third region being the emitter region, and wherein said first and second prescribed potentials are such that the P-N junction between said first and second semiconductor regions, corresponding to the base-collector junction, is reverse-biased.

* * * * *